US008546703B2

(12) United States Patent
Tang et al.

(10) Patent No.: US 8,546,703 B2
(45) Date of Patent: Oct. 1, 2013

(54) ENCLOSURE OF ELECTRONIC DEVICE

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 401 days.

(21) Appl. No.: 12/962,584

(22) Filed: Dec. 7, 2010

(65) Prior Publication Data

US 2012/0125681 A1    May 24, 2012

(30) Foreign Application Priority Data

Nov. 23, 2010  (CN) .......................... 2010 1 0555309

(51) Int. Cl.
*H05K 7/20*  (2006.01)
*H05K 5/00*  (2006.01)
*E06B 7/02*  (2006.01)

(52) U.S. Cl.
USPC ........... 174/547; 361/690; 361/692; 454/184; 49/38

(58) Field of Classification Search
USPC ................. 174/547; 361/690, 692; 454/184; 49/38
See application file for complete search history.

(56) References Cited

U.S. PATENT DOCUMENTS

| 14,798 | A | * | 5/1856 | Bruff | 49/38 |
|---|---|---|---|---|---|
| 1,303,410 | A | * | 5/1919 | Stowell | 454/115 |
| 1,390,544 | A | * | 9/1921 | Reuter | 126/20 |
| 1,740,626 | A | * | 12/1929 | Petrelli | 49/38 |
| 1,780,903 | A | * | 11/1930 | Berman | 454/151 |
| 1,812,595 | A | * | 6/1931 | Larson | 454/211 |
| 2,509,773 | A | * | 5/1950 | Leigh | 49/52 |
| 2,708,869 | A | * | 5/1955 | Grossenbacher et al. | 454/288 |
| 3,294,008 | A | * | 12/1966 | Cotts | 454/288 |
| 4,245,614 | A | * | 1/1981 | Hurwitz et al. | 126/502 |
| 4,964,566 | A | * | 10/1990 | Pugh et al. | 236/49.3 |
| 5,218,998 | A | * | 6/1993 | Bakken et al. | 137/625.28 |
| 5,427,146 | A | * | 6/1995 | Bakken et al. | 137/625.3 |
| 5,984,775 | A | * | 11/1999 | Lee et al. | 454/187 |
| 6,342,004 | B1 | * | 1/2002 | Lattimore et al. | 454/184 |
| 7,189,158 | B2 | * | 3/2007 | Motszko et al. | 454/143 |
| 7,733,646 | B2 | * | 6/2010 | Hisatsune | 361/690 |
| 7,826,213 | B2 | * | 11/2010 | Peng et al. | 361/679.46 |
| 2007/0047166 | A1 | * | 3/2007 | Creel | 361/118 |
| 2007/0053143 | A1 | * | 3/2007 | Kang | 361/678 |
| 2008/0112129 | A1 | * | 5/2008 | Kuo | 361/687 |
| 2009/0323280 | A1 | * | 12/2009 | Wu et al. | 361/690 |
| 2011/0170262 | A1 | * | 7/2011 | Cheng et al. | 361/692 |

* cited by examiner

*Primary Examiner* — Timothy Thompson
*Assistant Examiner* — Nathan Milakovich
(74) *Attorney, Agent, or Firm* — Altis & Wispro Law Group, Inc.

(57) ABSTRACT

An enclosure of an electronic device includes a chassis, a sliding plate slidably disposed on the chassis, and a pivot member. A number of vent holes and a location hole are defined in the chassis. A number of teeth are formed on a sidewall bounding the location hole. A through slot is defined in the sliding plate. A toothed rack is formed on a sidewall bounding the through slot. The pivot member extends through the through slot and the location hole. The pivot member includes a toothed portion engaging with the toothed rack and the teeth, and a smooth neck. When the toothed portion disengages from the teeth, the neck is pivotably received in the location hole, the pivot member is pivoted to drive the sliding member to slide relative to the chassis by the toothed portion rolling on the toothed rack, thereby exposing or covering the vent holes.

7 Claims, 6 Drawing Sheets

ENCLOSURE OF ELECTRONIC DEVICE

BACKGROUND

1. Technical Field

The present disclosure relates to an enclosure of an electronic device.

2. Description of Related Art

Often, there are several heat-generating components enclosed by an enclosure of an electronic device. Nowadays, there is a desire for adjusting airflow flowing into the enclosure according to how much heat is being generated by the heat-generating components.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
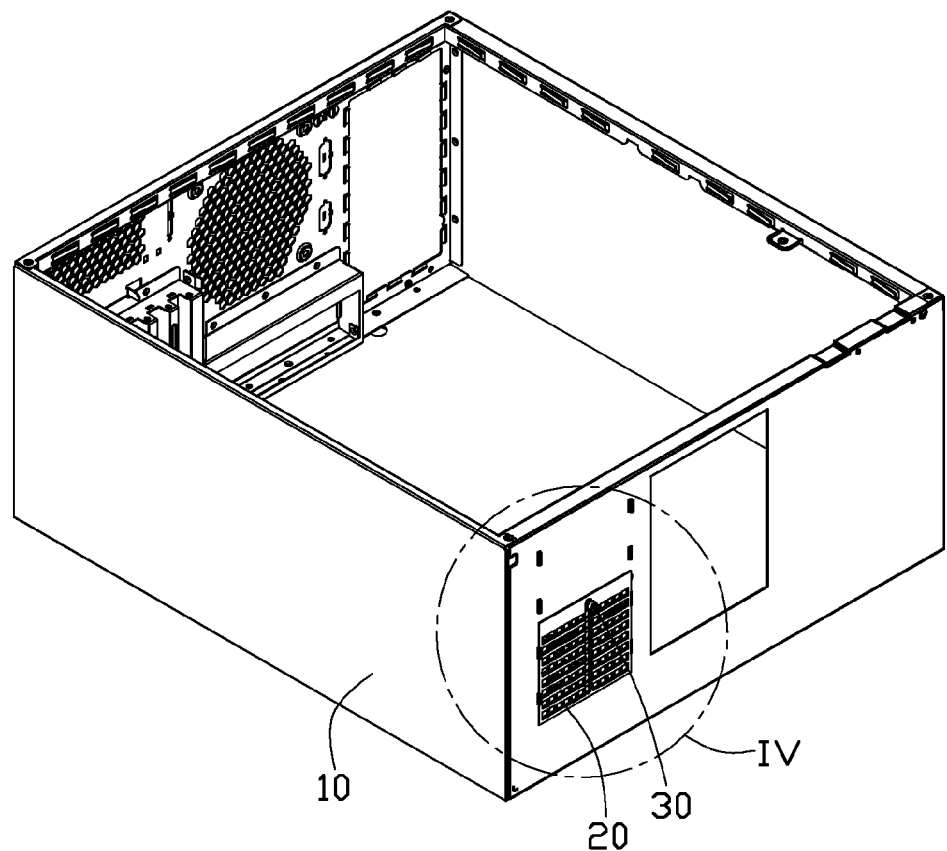
FIG. 1 is an assembled, isometric view of an exemplary embodiment of an enclosure of an electronic device, the enclosure includes a chassis, a sliding plate, and a pivot member.

Referring to FIG. 1, an enclosure in accordance with an exemplary embodiment includes a chassis 10, a sliding plate 20, and a captive fastener 30.

Figure 2:
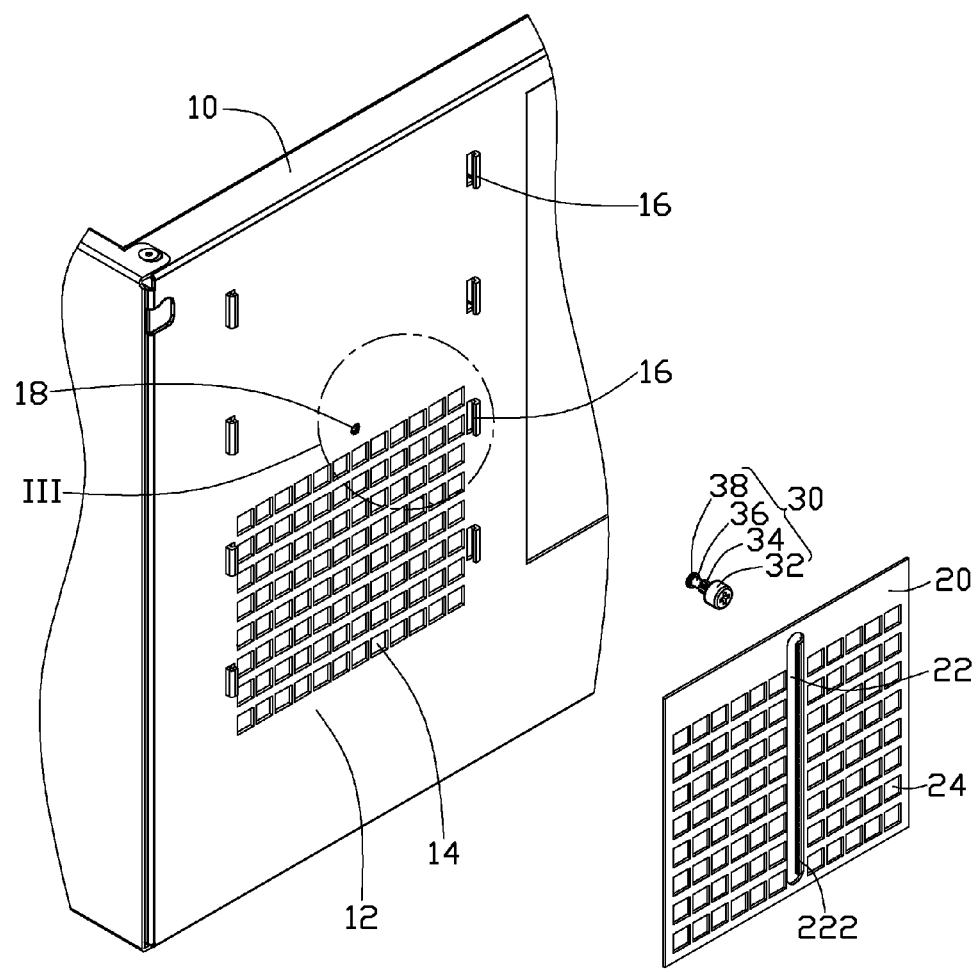
FIG. 2 is an exploded, isometric view of the enclosure of FIG. 1, showing only partial structure of the chassis.
Figure 3:
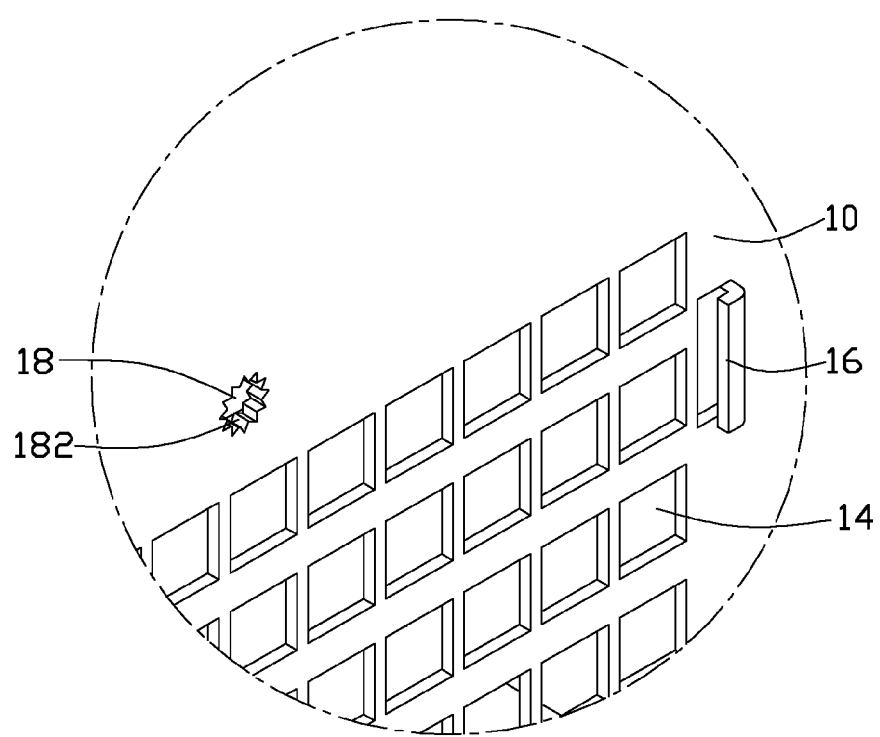
FIG. 3 is an enlarged, isometric view of an encircled portion III of FIG. 2.
Figure 4:
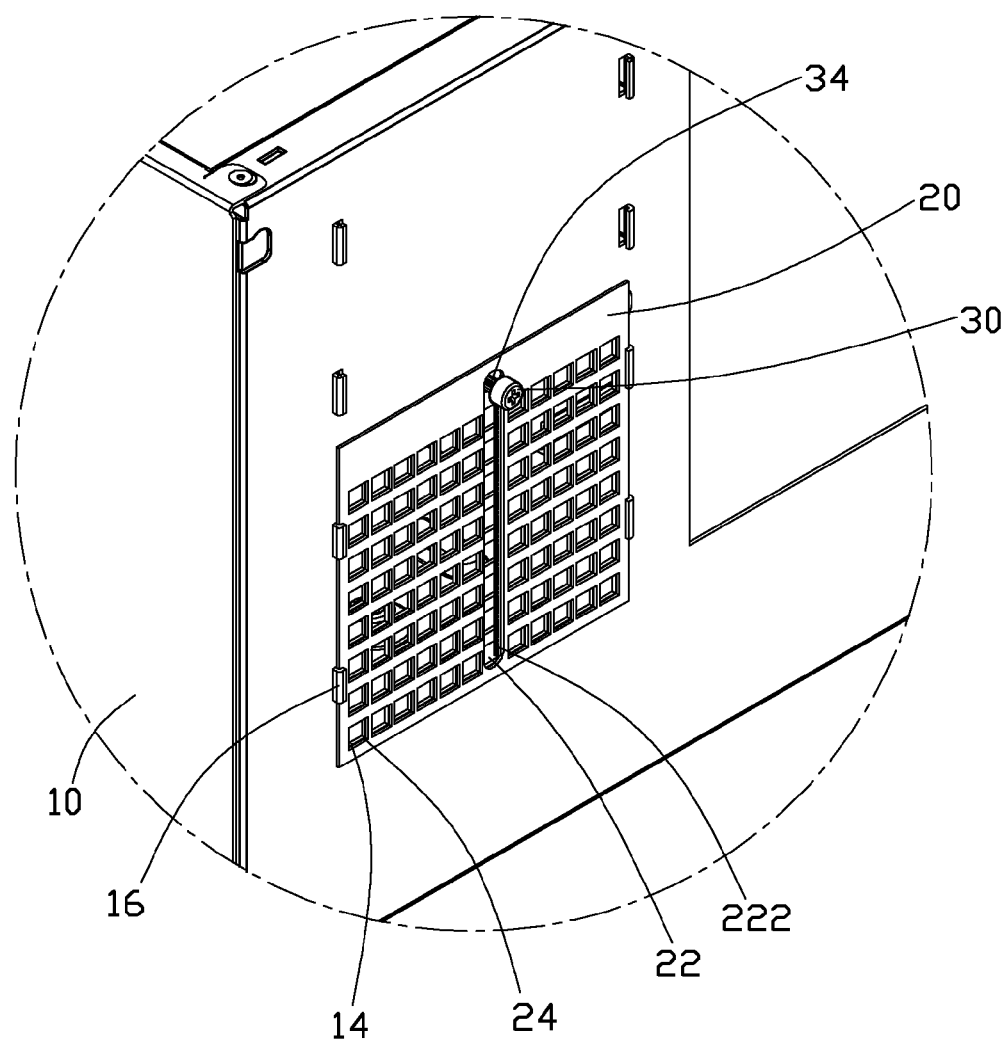
FIG. 4 is an enlarged, isometric view of an encircled portion IV of FIG. 1.

Referring to FIGS. 2 and 3, the chassis 10 includes a rectangular vent region 12. A plurality of arrayed vent holes 14 is defined in the vent region 12. Two parallel rows of clips 16 protrude from the chassis 10, respectively at opposite sides of the vent region 12. A circular locating hole 18 is defined in the chassis 10 between the rows of clips 16. A rack 182 is formed on a sidewall bounding the locating hole 18.

The sliding plate 20 is slidably mounted between the rows of clips 16. A longitudinal through slot 22 is defined in a center of the sliding plate 20. A plurality of arrayed vent holes 24 is defined in the sliding plate 20, corresponding to the vent holes 14 of the chassis 10. A longitudinal rack 222 extends from a long sidewall bounding the through slot 22.

The captive fastener 30 includes a head 32, a pinion 34 extending from the head 32, a smooth neck 36 extending from the pinion 34 away from the head 32, and a ring-shaped block 38 detachably mounted to the neck 36. A diameter of the neck 36 is less than an outer diameter of the pinion 34, and less than a diameter of the block 38, thereby allowing the neck 36 to extend through the locating hole 18 of the chassis 10 and allowing the pinion 34 to mesh with the rack 182.

Referring to FIGS. 1 to 4, in assembly, the sliding plate 20 is slidably disposed on the chassis 10, with the rows of clips 16 of the chassis 10 respectively clamping opposite sides of the sliding plate 20. The rack 222 extends along a sliding direction of the sliding plate 20. When the through slot 22 of the sliding plate 20 is in alignment with the locating hole 18 of the chassis 10, the captive fastener 30, without the block 38, extends through the through slot 22 and the locating hole 18, with the pinion 34 meshing with the rack 222 and the teeth rack 182. The block 38 fixedly fits about the neck 36. Thus, the captive fastener 30 is mounted to the chassis 10, with the head 32 and the block 38 respectively resisting against the sliding plate 20 and the chassis 10.

Figure 5:
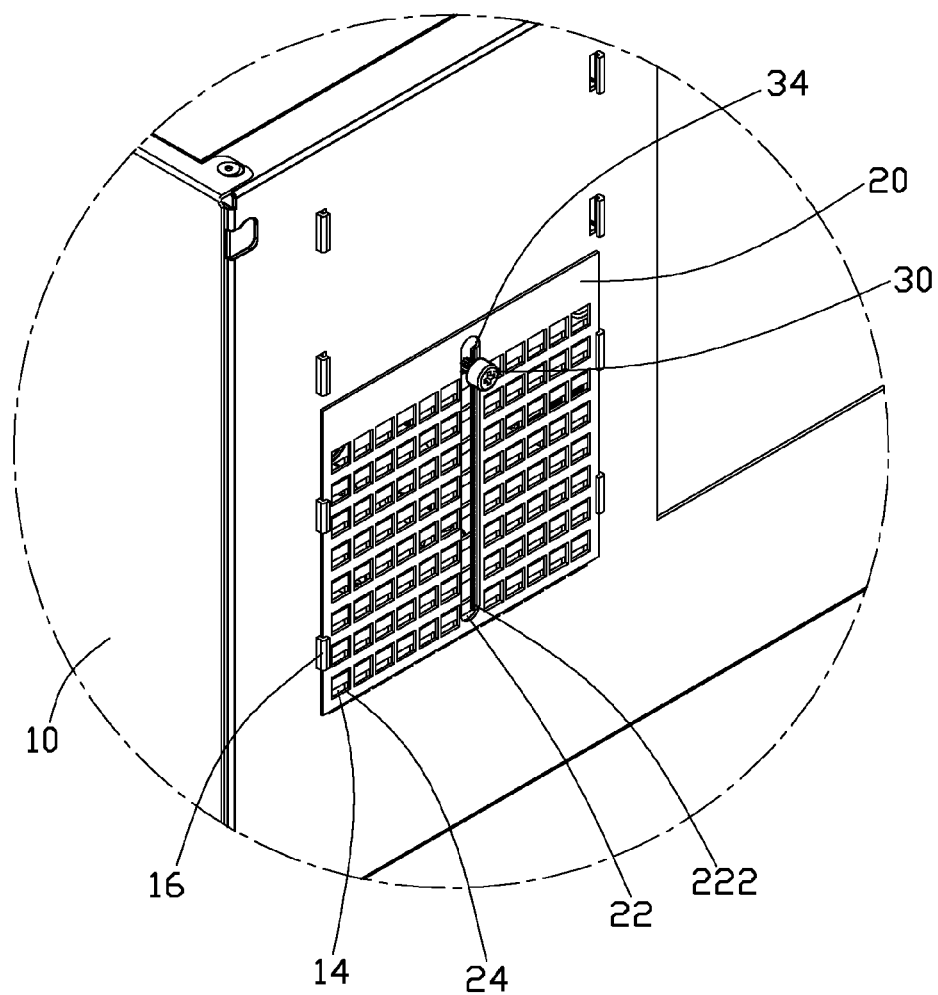
FIG. 5 shows a first use state of FIG. 4.
Figure 6:
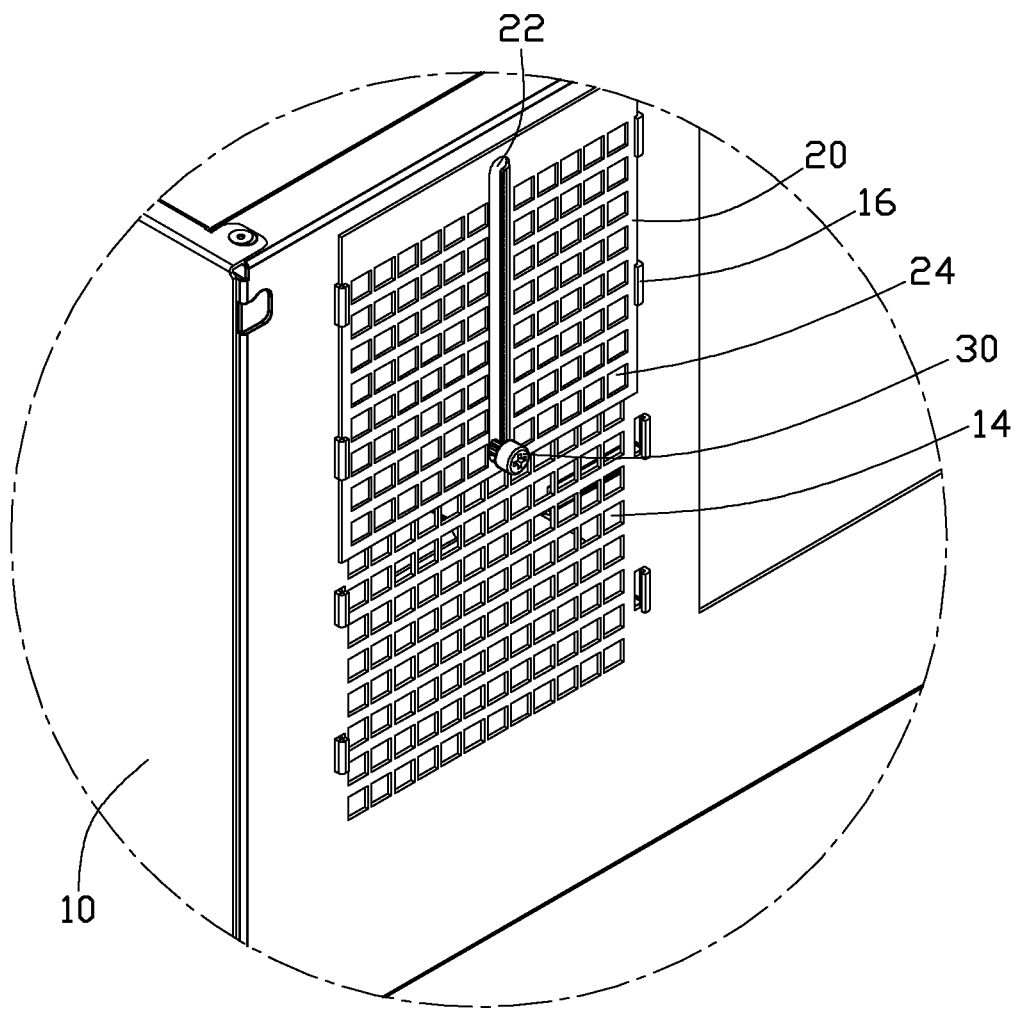
FIG. 6 shows a second use state of FIG. 4.

Referring to FIGS. 5 and 6, to adjust airflow flowing into the chassis 10, the captive fastener 30 is drawn outward. The pinion 34 disengages from the rack 182 and escapes from the locating hole 18, the pinion 34 only meshes with the rack 222 of the sliding plate 20, while the neck 36 extends into the locating hole 18. The captive fastener 30 is rotated by operating the head 32, the pinion 34 rolls on the rack 222, thereby driving the sliding plate 20 to slide relative to the chassis 10 along the rows of clips 16. The vent holes 24 of the sliding plate 20 can be set in alignment with or in partial alignment with the vent holes 14 of the chassis 10, thereby adjusting airflow flowing into the chassis 10. The captive fastener 30 is moved inward to allow the pinion 34 to mesh with the rack 182 again, thereby the sliding plate 20 is held in place.

In other embodiments, the sliding plate 20 does not define any vent hole 24. When the sliding plate 20 slides relative to the chassis 10, the sliding plate 20 exposes or covers the vent holes 14 of the chassis 10, thereby adjusting airflow flowing into the chassis 10.

It is to be understood, however, that even though numerous characteristics and advantages have been set forth in the foregoing description of embodiments, together with details of the structures and functions of the embodiments, the present disclosure is illustrative only and changes may be made in detail, especially in matters of shape, size, and arrangement of parts within the principles of the present disclosure to the full extent indicated by the broad general meaning of the terms in which the appended claims are expressed.

What is claimed is:

1. An enclosure of an electronic device, the enclosure comprising:
    a chassis defining a plurality of first vent holes and a locating hole, a first rack formed on a sidewall bounding the locating hole;
    a sliding plate slidably disposed on the chassis, the sliding plate defining a through slot, a second rack extending from a sidewall bounding the through slot, the second rack extending along a sliding direction of the sliding plate; and
    a captive fastener extending through the through slot and the locating hole, the captive fastener comprising a pinion meshing with the second rack and the first rack of the locating hole, and a smooth neck extending from the pinion;
    wherein when the pinion disengages from the first rack, the neck is pivotally received in the locating hole, the pinion only meshes with the second rack of the sliding plate, and the captive fastener is rotated to drive the sliding plate to slide relative to the chassis by the pinion rolling on the second rack, thereby exposing or covering the plurality of first vent holes.

2. The enclosure of claim 1, wherein the captive fastener further comprises a head and a block respectively resisting against the sliding plate and the chassis; the head is attached to the pinion opposite to the neck, and the block is detachably mounted to the neck.

3. The enclosure of claim 2, wherein the block is ring-shaped and fits about the neck, a diameter of the neck is less than an outer diameter of the pinion, and less than a diameter of the block.

4. The enclosure of claim 1, wherein two parallel rows of clips protrude from the chassis and respectively slidably clamp opposite sides of the sliding plate.

5. The enclosure of claim 1, wherein a plurality of second vent holes is defined in the sliding plate, corresponding to the plurality of first vent holes of the chassis.

6. An enclosure of an electronic device, the enclosure comprising:
   a chassis defining a plurality of first vent holes and a locating hole, a first rack formed on a sidewall bounding the locating hole;
   a sliding plate slidably disposed on the chassis, the sliding plate defining a through slot, a second rack extending from a sidewall bounding the through slot, the second rack extending along a sliding direction of the sliding plate; and
   a captive fastener comprising a pinion extending through the through slot and meshing with the second rack and the first rack of the chassis, and a neck extending from the pinion to pivotably mesh with the chassis; wherein
   when the pinion disengages from the first rack, the captive fastener is rotated, with the pinion meshing with the second rack, the sliding plate is driven to slide, thereby covering, uncovering, or partially covering the plurality of first vent holes of the chassis.

7. The enclosure of claim 6, wherein the sliding plate defines a plurality of second vent holes, corresponding to the plurality of first vent holes of the chassis.

* * * * *